United States Patent
Prein

[19]

[11] Patent Number: 6,121,074
[45] Date of Patent: Sep. 19, 2000

[54] FUSE LAYOUT FOR IMPROVED FUSE BLOW PROCESS WINDOW

[75] Inventor: Frank Prein, Glen Allen, Va.

[73] Assignee: Siemens Aktiengesellschaft, Munich, Germany

[21] Appl. No.: 09/186,515

[22] Filed: Nov. 5, 1998

[51] Int. Cl.[7] .................................................. H01L 21/82
[52] U.S. Cl. ........................................ 438/132; 438/601
[58] Field of Search .................................. 438/132, 601, 438/281, 333, 215; 257/529

[56] References Cited

U.S. PATENT DOCUMENTS

| | | | |
|---|---|---|---|
| 3,792,319 | 2/1974 | Tsang ........................................ | 257/529 |
| 4,455,194 | 6/1984 | Yabu et al. ............................... | 438/601 |
| 4,602,420 | 7/1986 | Saito ........................................ | 438/601 |
| 4,665,295 | 5/1987 | McDavid ............................. | 219/121.85 |
| 5,241,212 | 8/1993 | Motonami ................................ | 257/529 |
| 5,321,300 | 6/1994 | Usuda et al. ............................. | 257/529 |
| 5,521,116 | 5/1996 | Boku ....................................... | 438/601 |
| 5,550,399 | 8/1996 | Okazaki ................................... | 257/529 |
| 5,578,517 | 11/1996 | Yoo et al. ................................ | 438/132 |
| 5,760,453 | 6/1998 | Chen ........................................ | 257/529 |
| 5,773,857 | 6/1998 | Ura ........................................... | 257/211 |
| 5,844,295 | 12/1998 | Tsukude .................................. | 257/529 |
| 5,872,390 | 2/1999 | Lee ........................................... | 257/529 |
| 5,879,966 | 3/1999 | Lee ........................................... | 438/132 |
| 5,895,262 | 4/1999 | Becker et al. ........................... | 438/601 |

FOREIGN PATENT DOCUMENTS 1-107742  5/1986  Japan .

OTHER PUBLICATIONS

Muller and Kamins, "Device Electronics for Integrated Circuits", John Wiley & Sons, p. 103, 1986.

*Primary Examiner*—Charles Bowers
*Assistant Examiner*—Evan Pert
*Attorney, Agent, or Firm*—Donald B. Paschburg

[57] ABSTRACT

A method of fabricating a fuse for a semiconductor memory, in accordance with the invention, includes the steps of forming a gate structure on a substrate including a polysilicon fuse layer and a gate cap layer disposed above the polysilicon fuse layer, forming an interlevel dielectric layer over the gate structure, depositing a dielectric layer over the interlevel dielectric layer, the dielectric layer and the interlevel dielectric layer both including a material which is selectively etchable relative to the gate cap layer and selectively etching contact holes through the dielectric layer and the interlevel dielectric layer such that at least one contact hole is formed over the gate structure and extends into the gate cap layer.

18 Claims, 5 Drawing Sheets

FUSE LAYOUT FOR IMPROVED FUSE BLOW PROCESS WINDOW

BACKGROUND

1. Technical Field

This disclosure relates to semiconductor fabrication and more particularly, to a fuse layout which provides an improved fuse blow process window.

2. Description of the Related Art

Memory capacity in very large scale integration (VLSI) semiconductor devices is always increasing. This is enabled in part by the continually decreasing size of individual elements. In conjunction with an increased density of components, an increase in the ratio of faulty components is produced. Chips which include any faulty elements are considered faulty, which reduces the production yield. To solve this problem, spare circuits or redundant circuits are manufactured within the chip to provide spare elements to be used to replace faulty elements. When a faulty element is detected during testing, the redundant circuits are used in place of the faulty circuits to increase the yield of the device. Faulty elements or circuits are disabled and redundant elements or circuits are enabled by blowing fuses formed in the semiconductor device.

Fuses are blown when a sufficient amount of energy is present to melt or break a connection between two points. Energy is most often deposited using lasers at a given point on the fuse. Conventionally, to prepare a laser breakable fuse used in a memory redundancy, a filament fuse made of polysilicon, molybdenum silicide, etc. is formed on an oxide layer as part of a wiring layer. The fuse is formed and an interlevel insulating layer and a protection layer are formed.

Referring to FIG. 1, a cross-sectional view of a polysilicon fuse structure is shown. Fuse structure 10 includes a substrate 12, for example a monocrystalline silicon substrate. A thermal oxide layer 14 is formed on substrate 12. A gate structure 16 includes a polysilicon layer 18 used for the fuse. Polysilicon layer 18 is covered by a tungsten silicide layer 20. Polysilicon layer 18 and tungsten silicide layer 20 are electrically isolated using a gate cap 22 on top of gate structure 16 and spacers 24 on lateral sides of gate structure 16. Gate cap 22 and spacers 24 are preferably formed from silicon nitride. An additional silicon nitride layer 26 is preferably deposited over gate structure 16. An interlevel dielectric layer 28 is then deposited over gate structure 16. Interlevel dielectric layer 28 may include borophosphosilicate glass (BPSG) which is polished prior to the deposition of a dielectric layer 30, which includes, for example, an oxide. Dielectric layer 30 is patterned for metal lines to be deposited in later leaving a thinned dielectric layer 31 over the fuse.

During operations, if a fuse is to be broken, an energy source such as a laser is applied to the fuse. A process window is a range of permissible energy below which a fuse will not blow and above which the structure experiences collateral damage. The process window is exceeded when too much heat is generated trying to blow a fuse. While applying a laser beam to the fuse, the temperature increases until the fuse breaks. However, since the dielectric material including gate cap 22, interlevel dielectric layer 28 and dielectric layer 30 are present over the fuse and function as a thermal barrier, temperatures may increase to a level which may damage surrounding structures including the substrate, thereby causing additional failures and reducing chip yield.

Therefore, a need exists for a method of increasing the process window for laser blown fuses. A further need exists for a method of incorporating a fuse structure with an improved process window into the existing semiconductor fabrication process.

SUMMARY OF THE INVENTION

A method of fabricating a fuse for a semiconductor memory, in accordance with the invention, includes the steps of forming a gate structure on a substrate including a polysilicon fuse layer and a gate cap layer disposed above the polysilicon fuse layer, forming an interlevel dielectric layer over the gate structure, depositing a dielectric layer over the interlevel dielectric layer, the dielectric layer and the interlevel dielectric layer both including a material which is selectively etchable relative to the gate cap layer and selectively etching contact holes through the dielectric layer and the interlevel dielectric layer such that at least one contact hole is formed over the gate structure and extends into the gate cap layer.

Another method for fabricating a fuse for a semiconductor memory includes the steps of forming a gate structure on a substrate including a polysilicon fuse layer and a gate cap layer disposed above the polysilicon fuse layer, depositing a dielectric layer over the gate structure, the dielectric layer includes a material wherein the dielectric layer is selectively etchable relative to the gate cap layer, selectively etching contact holes in the dielectric layer such that at least one contact hole is formed over the gate structure and extends into the gate cap layer, depositing a conductive material in the contact holes to form the contacts and removing the conductive material from the at least one contact hole.

In other methods, the gate cap preferably includes nitride, the interlevel dielectric layer and the dielectric layer are preferably etchable selective to nitride and the step of selectively etching may further include the step of selectively etching the dielectric layer and the interlevel dielectric layer relative to nitride. The interlevel dielectric layer may include borophosphosilicate glass. The dielectric layer may include an oxide. The step of selectively etching contact holes may include the step of reducing a thickness of the gate cap layer to greater than or equal to 20 nm in thickness. The step of depositing a silicide between the polysilicon fuse layer and the gate cap layer may also be included. The step of depositing the conductive material in the contact holes to form the contacts includes the step of depositing tungsten in the contact holes.

A fuse structure for semiconductor memories includes a gate structure including a polysilicon fuse and a gate cap layer disposed above the polysilicon fuse. An interlevel dielectric layer is deposited on the gate structure, and a dielectric layer is deposited on the interlevel dielectric layer. The dielectric layer, the interlevel dielectric layer and the gate cap have at least one opening formed therein for removing a portion of the gate cap layer over the polysilicon fuse.

In alternate embodiments, the polysilicon fuse preferably includes a fuse capable of being blown by a laser beam. The at least one opening may extend through the gate cap layer such that a thickness of about greater than or equal to 20 nm of gate cap dielectric remains on the polysilicon fuse. The gate cap layer may include nitride, the dielectric layer may include oxide and the interlevel dielectric layer may include borophosphosilicate glass. The at least one opening extends a length of the fuse. The fuse structure may further include a silicide layer deposited on the polysilicon fuse.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication and more particularly, to a fuse layout which provides an improved fuse blow process window. The present invention provides a method and a fuse having a reduced amount of dielectric material over the fuse, thereby increasing the process window by preventing collateral damage. The present invention incorporates an etching process which is selective to nitride and etches holes or lines in conjunction with contacts to diffusion to "thin" the dielectric layer above the fuses. This permits less heating through dielectric materials and allows a faster fuse blow with less risk of collateral damage.

Figure 1:
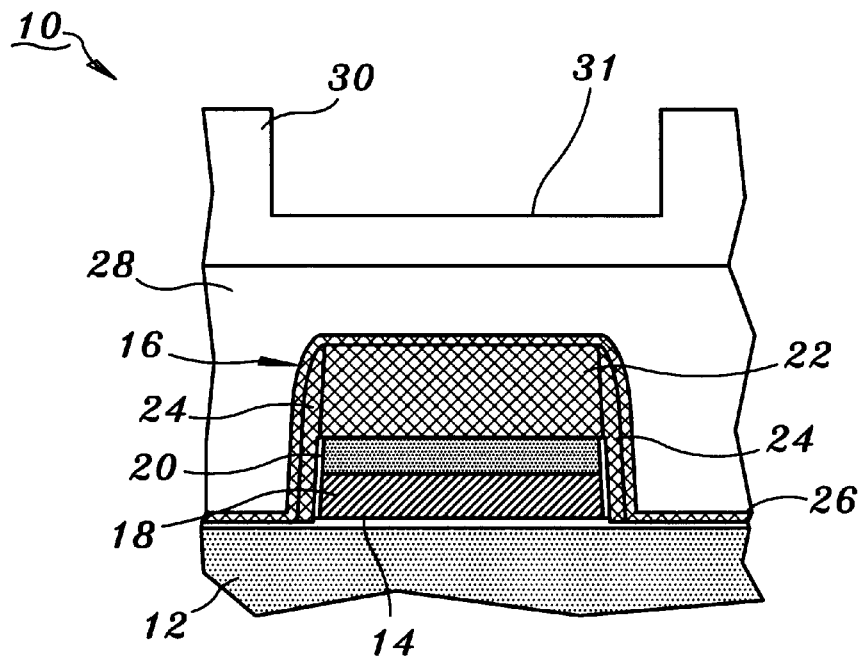
FIG. 1 is a cross-sectional view of a semiconductor memory device showing a polysilicon fuse structure in accordance with the prior art.
Figure 2:
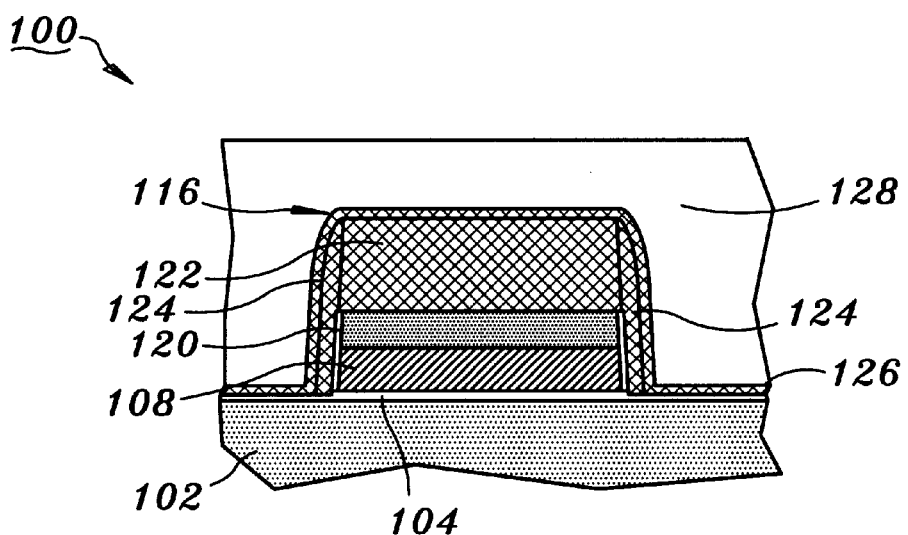
FIG. 2 is a cross-sectional view of a semiconductor memory device showing a polysilicon fuse structure having an interlevel dielectric layer deposited thereon in accordance with the present invention.

Referring now in specific detail to the drawings in which like reference numerals identify similar or identical elements throughout the several views, and initially to FIG. 2, a cross-sectional view of a polysilicon fuse structure 100 is shown in accordance with the present invention. Fuse structure 100 includes a substrate 102, for example a monocrystalline silicon substrate. A thermal oxide layer 104 is formed on substrate 102. A gate structure 116 includes a polysilicon layer 108 used for the fuse. Polysilicon layer 108 is covered by a silicide layer 120, for example tungsten silicide. Polysilicon layer 108 and silicide layer 120 have a gate cap 122 on top of gate structure 116 and spacers 124 on lateral sides of gate structure 116 thereby insulating polysilicon and silicide materials for the fuse. Gate cap 122 and spacers 124 are preferably formed from silicon nitride. An additional silicon nitride layer 126 is deposited over gate structure 116. An interlevel dielectric layer 128 is deposited over gate structure 116. Interlevel dielectric layer 128 preferably includes a dielectric material other than nitride. This will become apparent in later steps when a selective etch is performed in accordance with the invention. Interlevel dielectric layer 128 may include borophosphosilicate glass (BPSG), phosphosilicate glass (PSG), or equivalent material which may be etched selective to nitride. Interlevel dielectric layer 128 is polished prior to further processing.

Figure 3:
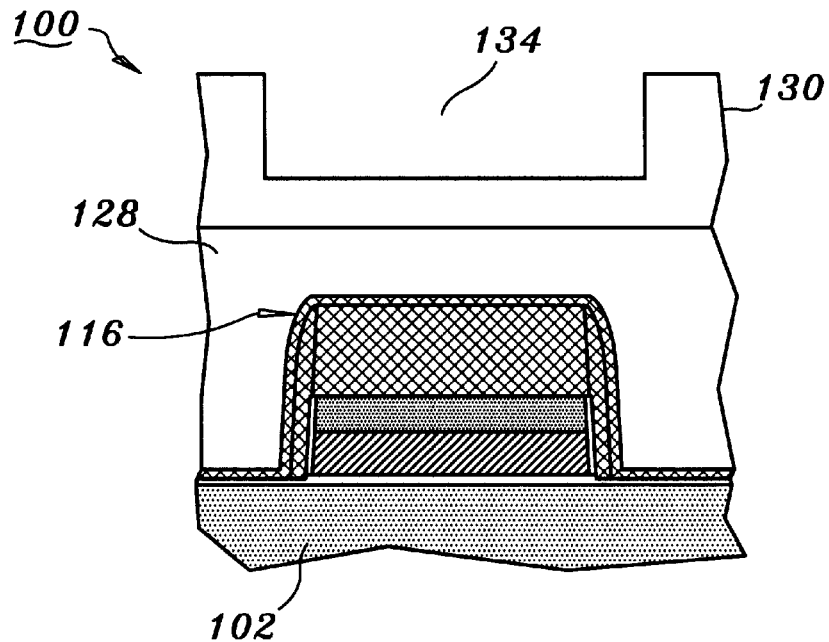
FIG. 3 is cross-sectional view of the semiconductor memory device of FIG. 2 showing a dielectric layer deposited on the interlevel dielectric layer and having a trench formed over a gate structure in accordance with the present invention.

Referring to FIG. 3, a dielectric layer 130 is deposited over the polished interlevel dielectric layer 128. Dielectric layer 130 preferably includes an oxide such as silicon oxide. Dielectric layer 130 may be an M0 level in a semiconductor memory fabrication process. Dielectric layer 130 is patterned and etched to form trenches for metal lines. A trench 134 is formed over gate structure 116.

Figure 4:
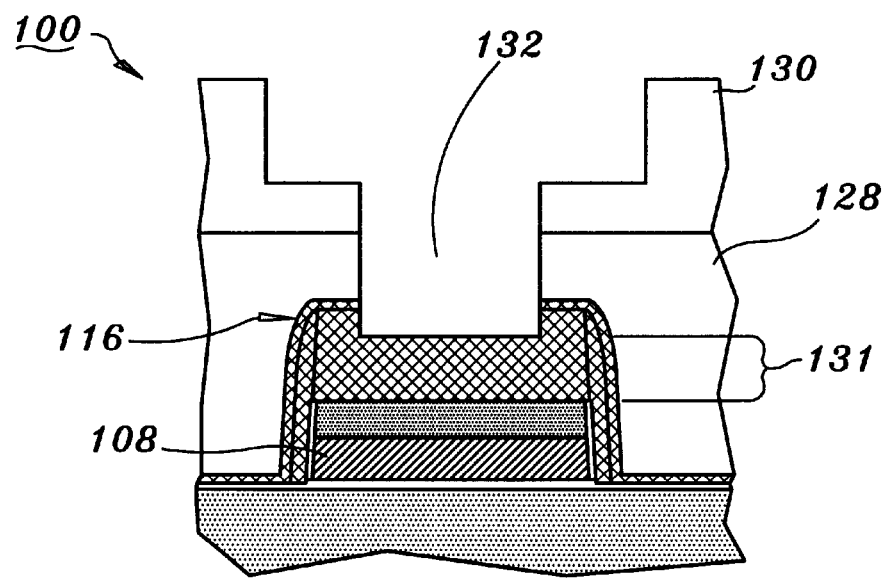
FIG. 4 is a cross-sectional view of the semiconductor memory device of FIG. 3 showing a hole formed through the dielectric layer, the interlevel dielectric layer and a gap cap in accordance with the present invention.

Referring to FIG. 4, an additional etching process is performed to create a hole 132 through remaining dielectric layer 130 and interlevel dielectric layer 128. Dielectric layer 130 is patterned for contact holes to diffusion regions on the semiconductor device. In accordance with the present invention, dielectric layer 130 and interlevel dielectric layer 128 are patterned to form hole 132 over gate structure 116. Hole 132 is formed in conjunction with and in the same way as contacts (not shown) on the rest of the semiconductor device. Hole 132 is formed by selectively etching interlevel dielectric layer 128 with respect to nitride. Since gate cap 122 is preferably nitride, hole 132 is etched through dielectric layer 130 and interlevel dielectric layer 128 and only a relatively small thickness of gate cap 122 is etched away. The more gate cap that is etched away the greater the improvement of the process window. In a preferred embodiment, a thickness 131 of about greater than or equal to 20 nm of nitride remains between hole 132 and silicide layer 120.

Figure 5:
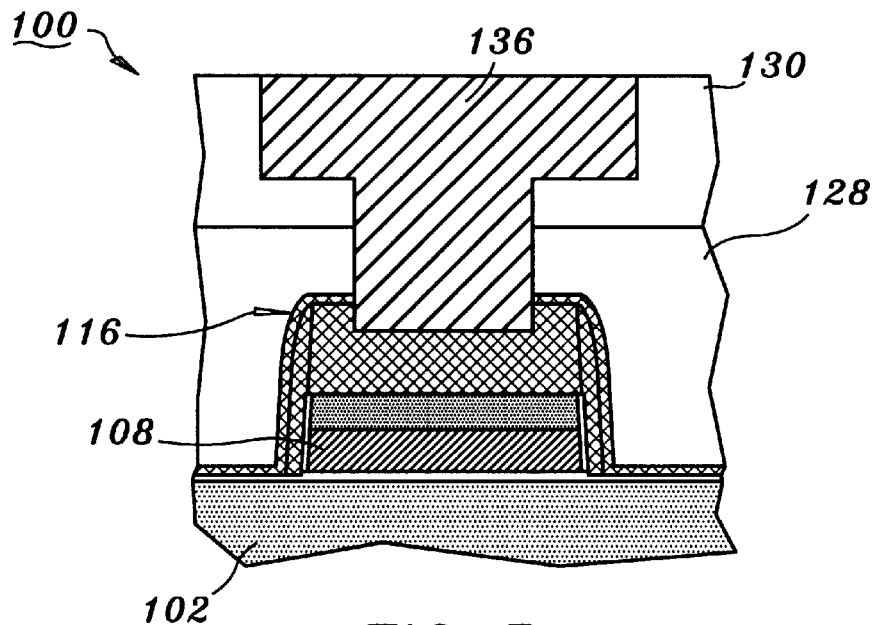
FIG. 5 is a cross-sectional view of the semiconductor memory device of FIG. 4 showing the hole filled with a conductive material in accordance with the present invention.
Figure 6:
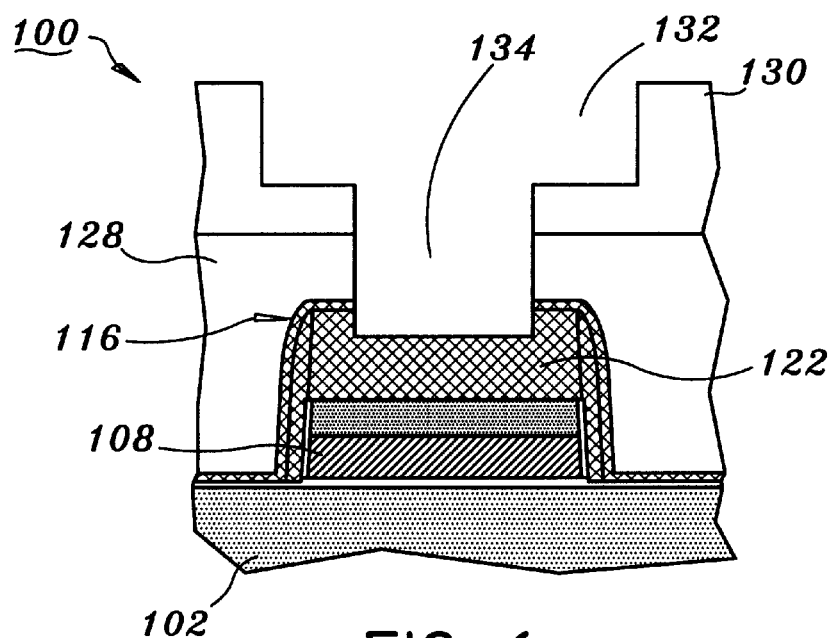
FIG. 6 is a cross-sectional view of the semiconductor memory device of FIG. 5 showing the conductive material removed from the hole in accordance with the present invention.

Referring to FIG. 5, conductive material 136 is deposited in hole 132. Conductive material 136 also forms contacts in appropriately patterned holes over other portions of the semiconductor device. Conductive material 136 preferably includes tungsten (W), molybdenum (Mo) or equivalent materials. In an alternate embodiment, holes 132 and 134 are simply masked by processes known in the art to prevent conductive metal 136 from entering during deposition. The mask material is then removed to reopen holes 132 and 134 and the configuration as shown in FIG. 6 below is achieved. If holes 132 134 are not masked conductive material 136 is removed as described below.

Referring to FIG. 6, conductive material 136 is removed from holes 132 and 134. In this way, gate structure 116 has a thinned dielectric layer which includes only gate cap 122 thereby providing a fuse with less dielectric material thereon. By reducing the amount of dielectric material over the fuse, energy of a laser, for example, may be applied over a shorter duration hence reducing the amount of energy imparted to the surroundings of the fuse.

During operations, if a fuse is to be broken, an energy source such as a laser is applied to the fuse. The process window is exceeded when too much heat is generated trying to blow a fuse. By thinning the dielectric material over the fuse less material is heated, i.e., less mass to heat. Further, while applying a laser beam to the fuse, the temperature increases until the fuse breaks. Since only the dielectric material including gate cap 122 remains over the fuse, only gate cap needs to be penetrated by heat of the laser thereby reducing the risk of collateral damage. The process window is therefore improved in accordance with the present invention.

Figure 7:
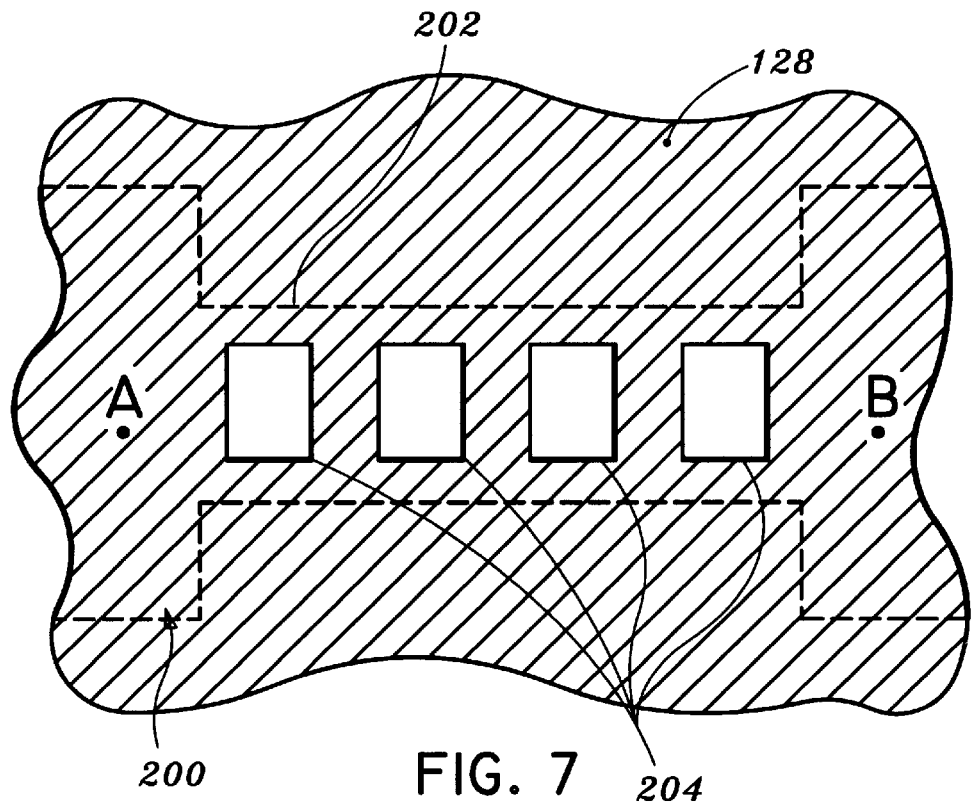
FIG. 7 is a top plan view of a fuse disposed below an interlevel dielectric layer and showing holes formed through the interlevel dielectric layer and into a gate cap layer in accordance with the present invention.

Referring to FIG. 7, a top plan view of a polysilicon fuse 200 is shown in accordance with the present invention. Fuse 200 has a reduced area section 202 such that when a sufficient amount of energy is applied to reduced area section 202, reduced area section 202 explodes or melts to provide a discontinuous path between point A and point B. In accordance with the invention, a plurality of openings or holes 204 are provided over the fuse to reduce the amount of energy needed to blow fuse 200 thereby improving the process window.

Figure 8:
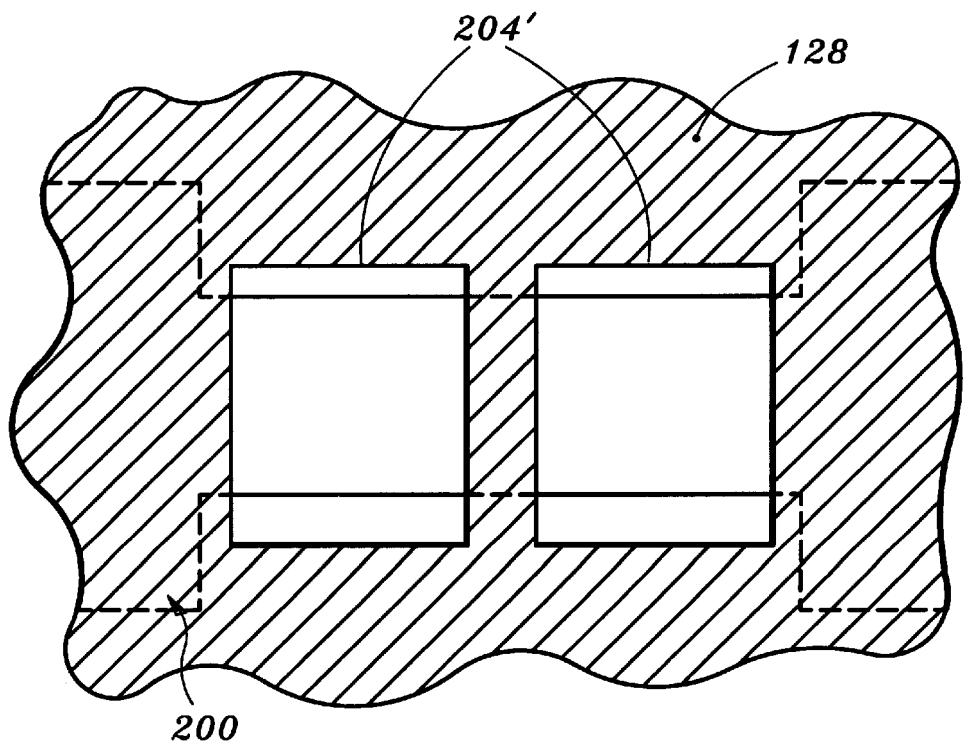
FIG. 8 is a top plan view of an alternate embodiment of a fuse disposed below an interlevel dielectric layer and showing alternate holes formed through the interlevel dielectric layer and into a gate cap layer in accordance with the present invention.
Figure 9:
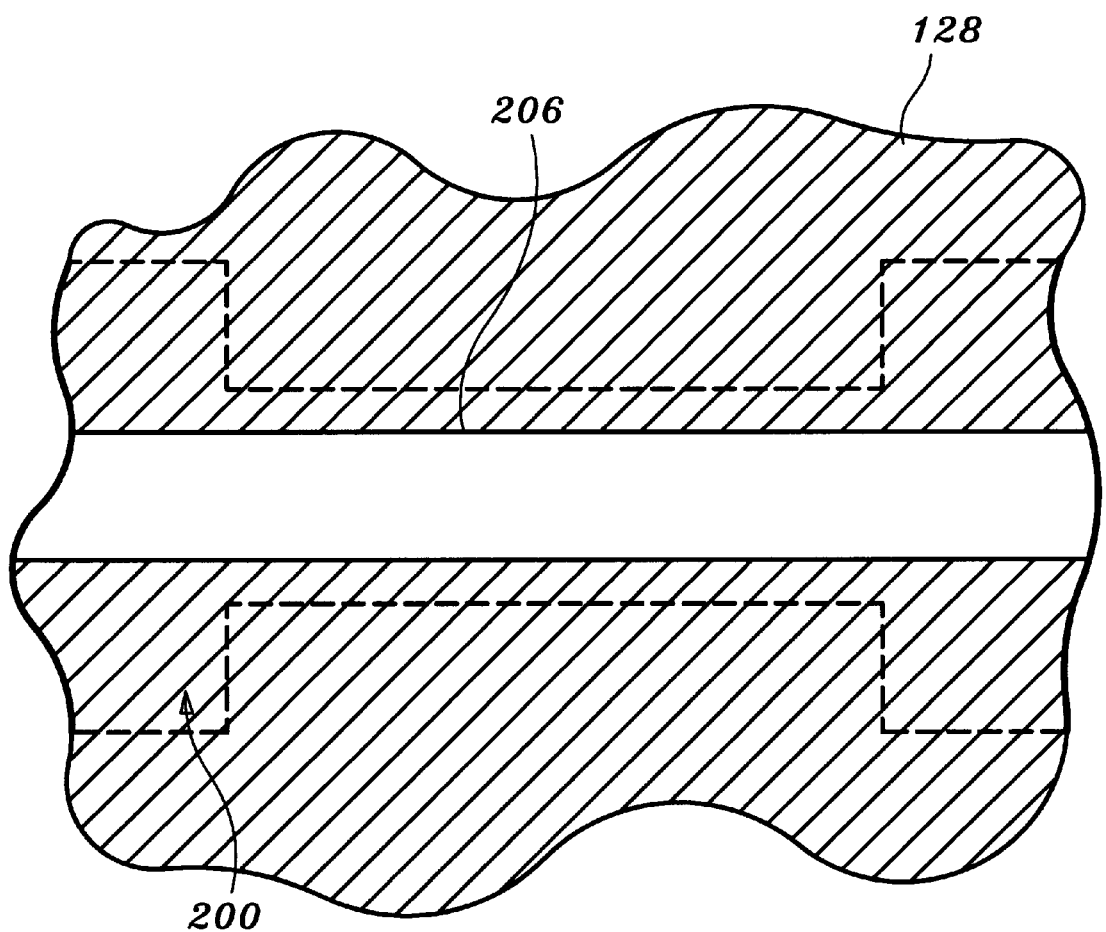
FIG. 9. is a top plan view of another alternate embodiment of a fuse disposed below an interlevel dielectric layer and showing a line or trench formed through the interlevel dielectric layer and into a gate cap layer and extending the length of the fuse and beyond in accordance with the present invention.

Other configurations may also be implemented in accordance with the present invention to achieve the same or similar results. Referring to FIG. 8, holes 204' are expanded to reach beyond fuse 200. In addition, holes may include a continuous line or hole 206 which extends along fuse 200 as shown in FIG. 9.

Having described preferred embodiments for a novel fuse layout for improved fuse blow process window (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method of fabricating a fuse for a semiconductor memory comprising the steps of:

forming a gate structure on a substrate including a polysilicon fuse layer and a gate cap layer disposed above the polysilicon fuse layer;

forming an interlevel dielectric layer over the gate structure;

depositing a dielectric layer over the interlevel dielectric layer, the dielectric layer and the interlevel dielectric layer both including a material which is selectively etchable relative to the gate cap layer; and selectively etching contact holes through the dielectric layer and the interlevel dielectric layer such that at least one contact hole is formed over the gate structure and extends into the gate cap layer.

2. The method as recited in claim 1, wherein the gate cap includes nitride.

3. The method as recited in claim 2, wherein the interlevel dielectric layer and the dielectric layer are etchable selective to nitride and the step of selectively etching further comprises the step of selectively etching the dielectric layer and the interlevel dielectric layer relative to nitride.

4. The method as recited in claim 1, wherein the interlevel dielectric layer includes borophosphosilicate glass.

5. The method as recited in claim 1, wherein the dielectric layer includes an oxide.

6. The method as recited in claim 1, wherein the step of selectively etching contact holes includes the step of reducing a thickness of the gate cap layer to greater than or equal to 20 nm in thickness.

7. The method as recited in claim 1, further comprising the step of depositing a silicide between the polysilicon fuse layer and the gate cap layer.

8. The method as recited in claim 1, wherein the at least one contact hole includes a plurality of contact holes extending over a length of the fuse.

9. The method as recited in claim 1, wherein the at least one contact hole extends a length of the fuse.

10. A method for fabricating a fuse for a semiconductor memory comprising the steps of:

forming a gate structure on a substrate including a polysilicon fuse and a gate cap layer disposed above the polysilicon fuse;

depositing a dielectric layer over the gate structure, the dielectric layer includes a material wherein the dielectric layer is selectively etchable relative to the gate cap layer;

selectively etching contact holes in the dielectric layer such that at least one contact hole is formed over the gate structure and extends into the gate cap layer;

depositing a conductive material in the contact holes to form the contacts; and removing the conductive material from the at least one contact hole.

11. The method as recited in claim 10, wherein the dielectric layer includes an borophosphosilicate glass layer and an oxide layer.

12. The method as recited in claim 10, wherein the step of selectively etching contact holes includes the step of reducing a thickness of the gate cap layer to greater than or equal to 20 nm in thickness.

13. The method as recited in claim 10, wherein the step of depositing the conductive material in the contact holes to form the contacts includes the step of depositing tungsten in the contact holes.

14. The method as recited in claim 10, wherein the gate cap includes nitride.

15. The method as recited in claim 14, wherein the dielectric layer is etchable selective to nitride and the step of selectively etching further comprises the step of selectively etching the dielectric layer relative to nitride.

16. The method as recited in claim 10, further comprising the step of depositing a silicide between the polysilicon fuse and the gate cap layer.

17. The method as recited in claim 10, wherein the at least one contact hole includes a plurality of contact holes extending over a length of the fuse.

18. The method as recited in claim 10, wherein the at least one contact hole extends a length of the fuse.

* * * * *